(12) United States Patent
Kolesnychenko et al.

(10) Patent No.: US 9,341,944 B2
(45) Date of Patent: May 17, 2016

(54) IMPRINT LITHOGRAPHY

(75) Inventors: Aleksey Yurievich Kolesnychenko, Helmond (NL); Helmar Van Santen, Amsterdam (NL); Yvonne Kruijt-Stegeman, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 1732 days.

(21) Appl. No.: 12/705,018

(22) Filed: Feb. 12, 2010

(65) Prior Publication Data

US 2010/0139862 A1 Jun. 10, 2010

Related U.S. Application Data

(63) Continuation of application No. 11/025,835, filed on Dec. 30, 2004, now Pat. No. 7,686,970.

(51) Int. Cl.
*G03F 7/00* (2006.01)
*B82Y 10/00* (2011.01)
*B82Y 40/00* (2011.01)

(52) U.S. Cl.
CPC ............... *G03F 7/0002* (2013.01); *B82Y 10/00* (2013.01); *B82Y 40/00* (2013.01)

(58) Field of Classification Search
USPC .................................................. 156/345.19
See application file for complete search history.

(56) References Cited

U.S. PATENT DOCUMENTS

| | | | |
|---|---|---|---|
| 5,512,131 A | 4/1996 | Kumar et al. | 156/655.1 |
| 5,597,613 A | 1/1997 | Galarneau et al. | |
| 5,772,905 A | 6/1998 | Chou | 216/44 |
| 6,165,911 A | 12/2000 | Calveley | 438/754 |
| 6,309,580 B1 | 10/2001 | Chou | 264/338 |
| 6,334,960 B1 | 1/2002 | Willson et al. | 216/52 |
| 6,365,059 B1 | 4/2002 | Pechenik | 216/52 |
| 6,375,870 B1 | 4/2002 | Visovsky et al. | 264/1.31 |
| 6,482,742 B1 | 11/2002 | Chou | 438/690 |
| 6,517,995 B1 | 2/2003 | Jacobson et al. | |
| 6,518,189 B1 | 2/2003 | Chou | 438/706 |

(Continued)

FOREIGN PATENT DOCUMENTS

| JP | 52-026171 | 2/1977 |
|---|---|---|
| JP | 02-185743 | 7/1990 |

(Continued)

OTHER PUBLICATIONS

Japanese Office Action mailed Nov. 16, 2011 in corresponding Japanese Patent Application No. 2009-091525.

(Continued)

*Primary Examiner* — Parviz Hassanzadeh
*Assistant Examiner* — Nathan K Ford
(74) *Attorney, Agent, or Firm* — Pillsbury Winthrop Shaw Pittman LLP

(57) ABSTRACT

A method for manufacturing a working template for use in imprint lithography is disclosed, which in an embodiment, involves contacting a first target region of an imprintable medium on a working template substrate with a master template to form a first imprint in the medium, the imprint defining a part of a working template pattern, separating the master template from the imprinted medium, contacting a second target region of the medium with the master template to form a second imprint in the medium, the second imprint defining a further part of the working template pattern, and separating the master template from the imprinted medium.

20 Claims, 7 Drawing Sheets

(56) References Cited

U.S. PATENT DOCUMENTS

| | | |
|---|---|---|
| 6,656,341 B2 | 12/2003 | Petersson et al. ............. 205/667 |
| 6,696,220 B2 | 2/2004 | Bailey et al. ............... 430/272.1 |
| 6,719,915 B2 | 4/2004 | Willson et al. ................. 216/44 |
| 6,818,139 B1 | 11/2004 | Lee et al. |
| 6,849,558 B2 | 2/2005 | Schaper |
| 6,900,881 B2 | 5/2005 | Sreenivasan et al. |
| 6,921,615 B2 | 7/2005 | Sreenivasan et al. ........... 430/22 |
| 6,943,117 B2 | 9/2005 | Jeong et al. |
| 2002/0093122 A1 | 7/2002 | Choi et al. .................... 264/401 |
| 2002/0094496 A1 | 7/2002 | Choi et al. .................... 430/322 |
| 2002/0132482 A1 | 9/2002 | Chou ............................ 438/692 |
| 2002/0167117 A1 | 11/2002 | Chou ............................ 264/338 |
| 2002/0177319 A1 | 11/2002 | Chou ............................ 438/690 |
| 2003/0034329 A1 | 2/2003 | Chou ............................. 216/44 |
| 2003/0071016 A1 | 4/2003 | Shih et al. |
| 2003/0080471 A1 | 5/2003 | Chou ............................ 264/338 |
| 2003/0080472 A1 | 5/2003 | Chou ............................ 264/338 |
| 2003/0081193 A1 | 5/2003 | White et al. .................... 355/72 |
| 2003/0127580 A1 | 7/2003 | Ling et al. ..................... 249/115 |
| 2003/0139042 A1 | 7/2003 | Heidari ......................... 438/689 |
| 2003/0141291 A1 | 7/2003 | Heidari et al. .............. 219/460.1 |
| 2003/0159608 A1 | 8/2003 | Heidari ......................... 101/494 |
| 2003/0170053 A1 | 9/2003 | Montelius et al. ............. 399/318 |
| 2003/0189273 A1 | 10/2003 | Olsson .......................... 264/293 |
| 2003/0205657 A1 | 11/2003 | Voisin |
| 2004/0005444 A1 | 1/2004 | Heidari ......................... 428/212 |
| 2004/0009673 A1 | 1/2004 | Sreenivasan et al. .......... 438/694 |
| 2004/0021866 A1 | 2/2004 | Watts et al. .................... 356/401 |
| 2004/0022888 A1 | 2/2004 | Sreenivasan et al. ....... 425/174.4 |
| 2004/0036201 A1 | 2/2004 | Chou et al. .................... 264/402 |
| 2004/0046288 A1 | 3/2004 | Chou ............................ 264/479 |
| 2004/0081798 A1 | 4/2004 | Lee et al. ....................... 428/141 |
| 2004/0124566 A1 | 7/2004 | Sreenivasan et al. .......... 264/494 |
| 2004/0149367 A1 | 8/2004 | Olsson et al. ................... 156/64 |
| 2004/0169003 A1 | 9/2004 | Lee et al. ......................... 216/4 |
| 2004/0192041 A1 | 9/2004 | Jeong et al. .................... 438/689 |
| 2004/0200368 A1 | 10/2004 | Ogino et al. |
| 2004/0200411 A1 | 10/2004 | Willson et al. ................. 118/500 |
| 2004/0209470 A1 | 10/2004 | Bajorek ......................... 438/689 |
| 2004/0219249 A1 | 11/2004 | Chung et al. ................... 425/385 |
| 2004/0219461 A1 | 11/2004 | Chung et al. ................... 430/311 |
| 2005/0039618 A1 | 2/2005 | Heidari et al. ................. 101/368 |
| 2005/0064054 A1 | 3/2005 | Kasumi ......................... 425/112 |
| 2005/0159019 A1 | 7/2005 | Lee ................................ 438/800 |
| 2005/0189676 A1* | 9/2005 | Sreenivasan .................. 264/225 |

FOREIGN PATENT DOCUMENTS

| | | |
|---|---|---|
| JP | 2000-158458 | 6/2000 |
| JP | 2001-234383 | 8/2001 |
| JP | 2002-543582 | 12/2002 |
| JP | 2003-509228 | 3/2003 |
| JP | 2003-094445 | 4/2003 |
| JP | 2003-109915 | 4/2003 |
| JP | 2004-071587 | 3/2004 |
| JP | 2004-103817 | 4/2004 |
| JP | 2004-288845 | 10/2004 |
| JP | 2004-304097 | 10/2004 |
| JP | 2004-327994 | 11/2004 |
| JP | 2005-088444 | 4/2005 |
| JP | 2005-103991 | 4/2005 |
| JP | 2005-116022 | 4/2005 |
| JP | 2005-173597 | 6/2005 |
| JP | 2005-203797 | 7/2005 |
| JP | 2005-533393 | 11/2005 |
| JP | 2005-539396 | 12/2005 |
| JP | 2006-521682 | 9/2006 |
| WO | 01/79591 A1 | 10/2001 |
| WO | 01/79592 A1 | 10/2001 |
| WO | 02/06902 | 1/2002 |
| WO | 2004/016406 | 2/2004 |
| WO | 2004/086471 | 10/2004 |

OTHER PUBLICATIONS

Stephen Y. Chou et al. "Nanoimprint Lithography" J. Vac. Sci. Technol. B 14(6) Nov./Dec. 1996 pp. 4129-4133.

H. Schulz, et al., "Master replication into thermosetting polymers for nanoimprinting," Journal of Vacuum Science and Technology B, vol. 18, issue 6, Nov. 2000, pp. 3582-3585.

Dario Pisignano, et al., "Nanostructuring poly-[2-methoxy-5-(2'-ethyl-hexiloxy)-p-phenylenevinylene] thin films by high-temperature soft lithography," Synthetic Metals, vol. 139, issue 3, Oct. 9, 2003, pp. 679-681.

English Translation of Japanese Official Action issued on Jan. 5, 2009 in Japanese Application No. 2005-377640.

Office Action dated Jul. 28, 2010 issued in Japanese Application No. 2005-377640.

* cited by examiner

IMPRINT LITHOGRAPHY

This application is a continuation of co-pending U.S. patent application Ser. No. 11/025,835, filed Dec. 30, 2004, now U.S. Pat. No. 7,686,970 now allowed, which application is incorporated herein in its entirety by reference.

FIELD

The invention relates to imprint lithography.

BACKGROUND

A lithographic apparatus is a machine that applies a desired pattern onto a target portion of a substrate. Lithographic apparatus are conventionally used, for example, in the manufacture of integrated circuits (ICs), flat panel displays and other devices involving fine structures.

It is desirable to reduce the size of features in a lithographic pattern because this allows for a greater density of features on a given substrate area. In photolithography, the increased resolution may be achieved by using radiation of a short wavelength. However, there are problems associated with such reductions. Lithographic apparatus using 193 nm wavelength radiation are starting to be adopted but even at this level, diffraction limitations may become a barrier. At lower wavelengths, the transparency of projection system materials is poor. Thus, optical lithography capable of enhanced resolution will likely require complex optics and rare materials and thus will be expensive.

An alternative method to printing sub-100 nm features, known as imprint lithography, comprises transferring a pattern to a substrate by imprinting a pattern into an imprintable medium using a physical mould or template. The imprintable medium may be the substrate or a material coated onto a surface of the substrate. The imprintable medium may be functional or may be used as a "mask" to transfer a pattern to an underlying surface. The imprintable medium may, for instance, be provided as a resist deposited on a substrate, such as a semiconductor material, to which the pattern defined by the template is to be transferred. Imprint lithography is thus essentially a moulding process on a micrometer or nanometer scale in which the topography of a template defines the patterns created on a substrate. Patterns may be layered as with optical lithography processes so that in principle imprint lithography could be used for such applications as integrated circuit manufacture.

The resolution of imprint lithography is limited only by the resolution of the template fabrication process. For instance, imprint lithography has been used to produce features in the sub-50 nm range with good resolution and line edge roughness. In addition, imprint processes may not require the expensive optics, advanced illumination sources or specialized resist materials typically required for optical lithography processes.

SUMMARY

According to an aspect of the invention, there is provided a method for manufacturing a working template for use in imprint lithography, comprising:

contacting a first target region of an imprintable medium on a working template substrate with a master template to form a first imprint in the medium, the imprint defining a part of a working template pattern;

separating the master template from the imprinted medium;

contacting a second target region of the medium with the master template to form a second imprint in the medium, the second imprint defining a further part of the working template pattern; and separating the master template from the imprinted medium.

According to an aspect of the invention, there is provided a method for manufacturing a working template for use in imprint lithography, comprising:

contacting a first target region of an imprintable medium on a working template substrate with a master template to form a first imprint in the medium, the first imprint comprising a first pattern feature and a first area of reduced thickness and defining a part of a working template pattern;

separating the master template from the imprinted medium;

contacting a second target region of the medium with the master template to form a second imprint in the medium, the second imprint comprising a second pattern feature and a second area of reduced thickness and defining a further part of the working template pattern;

separating the master template from the imprinted medium;

etching the first and second areas of reduced thickness to expose regions of the working template substrate; and etching the exposed regions of the working template substrate to form the working template pattern in the working template substrate to define a working template.

Thus, in an embodiment, a smaller master template may be repeatedly imprinted in to an imprintable medium which is then processed to form a larger 'modular' pattern in a working template substrate. In this way, the expense connected with the manufacture of the initial master template employing e-beam etching may be reduced. Additionally, since the master template may be imprinted into the imprintable medium any desirable number of times, relatively large working template may be cheaply and easily produced.

According to an aspect of the invention, there is provided a method for manufacturing a photo transparent working template for use in imprint lithography, comprising:

contacting a target region of an imprintable medium on a photo transparent working template substrate with a master template to form an imprint defining a working template pattern in the medium; and separating the master template from the imprinted medium to provide a photo transparent working template.

According to an aspect of the invention, there is provided a method for manufacturing a photo transparent working template for use in imprint lithography, comprising:

contacting a target region of an imprintable medium on a photo transparent working template substrate with a master template to form an imprint defining a working template pattern in the medium, the imprint comprising a pattern feature and an area of reduced thickness;

separating the master template from the imprinted medium;

etching the area of reduced thickness to expose a region of the photo transparent working template substrate; and etching the exposed region of the photo transparent working template substrate to form the working template pattern in the photo transparent working template substrate to define a photo transparent working template.

According to an aspect of the invention, there is provided an imprinting method, comprising:

contacting a first target region of a first imprintable medium on a working template substrate with a master template to form an imprint in the first medium, the imprint defining a part of a working template pattern;

separating the master template from the imprinted first medium;

contacting a second target region of the first medium with the master template to form a second imprint in the first medium, the second imprint defining a further part of the working template pattern;

separating the master template from the imprinted first medium to provide a working template;

contacting a second imprintable medium on a device substrate with the working template to form an imprint in the second medium corresponding to the working template pattern; and separating the working template from the imprinted second medium.

According to an aspect of the invention, there is provided an imprinting method, comprising:

contacting a first target region of a first imprintable medium on a working template substrate with a master template to form a first imprint in the first medium, the first imprint comprising a first pattern feature and a first area of reduced thickness and defining a part of a working template pattern;

separating the master template from the imprinted first medium;

contacting a second target region of the first medium with the master template to form a second imprint in the first medium, the second imprint comprising a second pattern feature and a second area of reduced thickness and defining a further part of the working template pattern;

separating the master template from the imprinted first medium;

etching the first and second areas of reduced thickness to expose regions of the working template substrate;

etching the exposed regions of the working template substrate to form the working template pattern in the working template substrate to define a working template;

contacting a second imprintable medium on a device substrate with the working template to form an imprint in the second medium corresponding to the working template pattern; and separating the working template from the imprinted second medium.

According to an aspect of the invention, there is provided a method for patterning a device substrate, comprising:

contacting a first target region of a first imprintable medium on a working template substrate with a master template to form a first imprint in the first medium, the first imprint defining a part of a working template pattern;

separating the master template from the imprinted first medium;

contacting a second target region of the first medium with the master template to form a second imprint in the first medium, the second imprint defining a further part of the working template pattern;

separating the master template from the imprinted first medium to provide a working template;

contacting a second imprintable medium on a device substrate with the working template to form an imprint in the second medium corresponding to the working template pattern, the imprint in the second medium comprising a pattern feature and an area of reduced thickness;

separating the working template from the imprinted second medium;

etching the area of reduced thickness of the imprint in the second medium to expose a region of the device substrate; and etching the exposed region of the device substrate to form the working template pattern in the device substrate.

According to an aspect of the invention, there is provided a method for patterning a device substrate, comprising:

contacting a first target region of a first imprintable medium on a working template substrate with a master template to form a first imprint in the first medium, the first imprint comprising a first pattern feature and a first area of reduced thickness and defining a part of a working template pattern;

separating the master template from the imprinted first medium;

contacting a second target region of the first medium with the master template to form a second imprint in the first medium, the second imprint comprising a second pattern feature and a second area of reduced thickness and defining a further part of the working template pattern;

separating the master template from the imprinted first medium;

etching the first and second areas of reduced thickness to expose regions of the working template substrate;

etching the exposed regions of the working template substrate to form the working template pattern in the working template substrate to define a working template;

contacting a second imprintable medium on a device substrate with the working template to form an imprint in the second medium corresponding to the working template pattern, the imprint in the second medium comprising a pattern feature and an area of reduced thickness;

separating the working template from the imprinted second medium;

etching the area of reduced thickness of the imprint in the second medium to expose a region of the device substrate; and etching the exposed region of the device substrate to form the working template pattern in the device substrate.

According to an aspect of the invention, there is provided a working template manufacturing apparatus, comprising:

a substrate holder configured to hold a substrate having a imprintable medium thereon;

a template holder configured to cause a master template supported by the template holder to contact the imprintable medium to form a first imprint in the medium, the first imprint defining a part of a working template pattern, to cause the master template to contact the imprintable medium to form a second imprint in the medium, the second imprint defining a further part of the working template pattern, and to cause the master template to separate from the imprinted medium; and an etching apparatus.

According to an aspect of the invention, there is provided a working template manufacturing apparatus, comprising:

a substrate holder configured to hold a substrate having a imprintable medium thereon;

a template holder configured to cause a master template supported by the template holder to contact the imprintable medium to form a first imprint in the medium, the first imprint comprising a first pattern feature and a first area of reduced thickness and defining a part of a working template pattern, to cause the master template to contact the imprintable medium to form a second imprint in the medium, the second imprint comprising a second pattern feature and a second area of reduced thickness and defining a further part of the working template pattern, and to cause the master template to separate from the imprinted medium; and an etching apparatus configured to etch the first and second areas of reduced thickness to expose regions of the working template substrate and to etch the exposed regions of the working template substrate to form the final pattern in the working template substrate to define a working template.

In respect of the aforementioned aspects of the invention, in an embodiment, the target regions are laterally spaced from one another. In an embodiment, the target regions are provided separately on the working template substrate.

In an embodiment, the working template substrate is photo transparent. In an embodiment, the working template substrate comprises silicon and/or quartz.

Conveniently, the exposed regions of the working template substrate may be etched using an etchant selected from a group consisting of: $CHF_3$, $CF_4$, $O_2$, $Cl_2$, HBr and $SF_6$.

In an embodiment, the imprintable medium is selected from a group consisting of: a photo (e.g. UV) curable material, a thermally curable material and a thermoplastic polymer material. In an embodiment, the imprintable medium is in a flowable state when contacted by the master or working template and is solidified prior to separation from the master or working template. Depending upon which material is chosen as the imprintable medium, the method forming one of the above aspects of the invention may additionally comprise solidifying the imprintable medium by the provision of photo radiation, heat (e.g. to cross link a thermally crosslinkable polymer, such as a thermosetting resin) or cooling (e.g. to below the glass transition temperature of a thermoplastic polymer).

In an embodiment, an intermediate layer (which may comprise a material selected from a group consisting of: chromium, an oxide and a nitride) is provided between the working template substrate and the imprintable medium. In an embodiment, etching an area of reduced thickness defined in the imprintable medium exposes a region of the intermediate layer and the method may further comprise etching the exposed region of the intermediate layer to expose a region of the working template substrate. In this case, the method may further comprise etching (for example, by using an etchant selected from a group consisting of: hydrofluoric acid, $O_2$ and $Cl_2$) the exposed region of the working template substrate to form the working template pattern in the working template substrate to define the working template.

In an embodiment, the working template pattern covers substantially all of a surface of the working template substrate. The area of imprint formed in the imprintable medium by contact of the master template may represent up to 50% of the area of the working template pattern. In an embodiment, the area of the imprint may represent up to 25% or up to 10% of the area of the working template pattern.

In an embodiment, the master template has been produced using a method employing e-beam etching.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

There are two principal approaches to imprint lithography which will be termed generally as hot imprint lithography and UV imprint lithography. There is also a third type of "printing" lithography known as soft lithography. Examples of these are illustrated in FIGS. 1a to 1c.

Figure 1A:
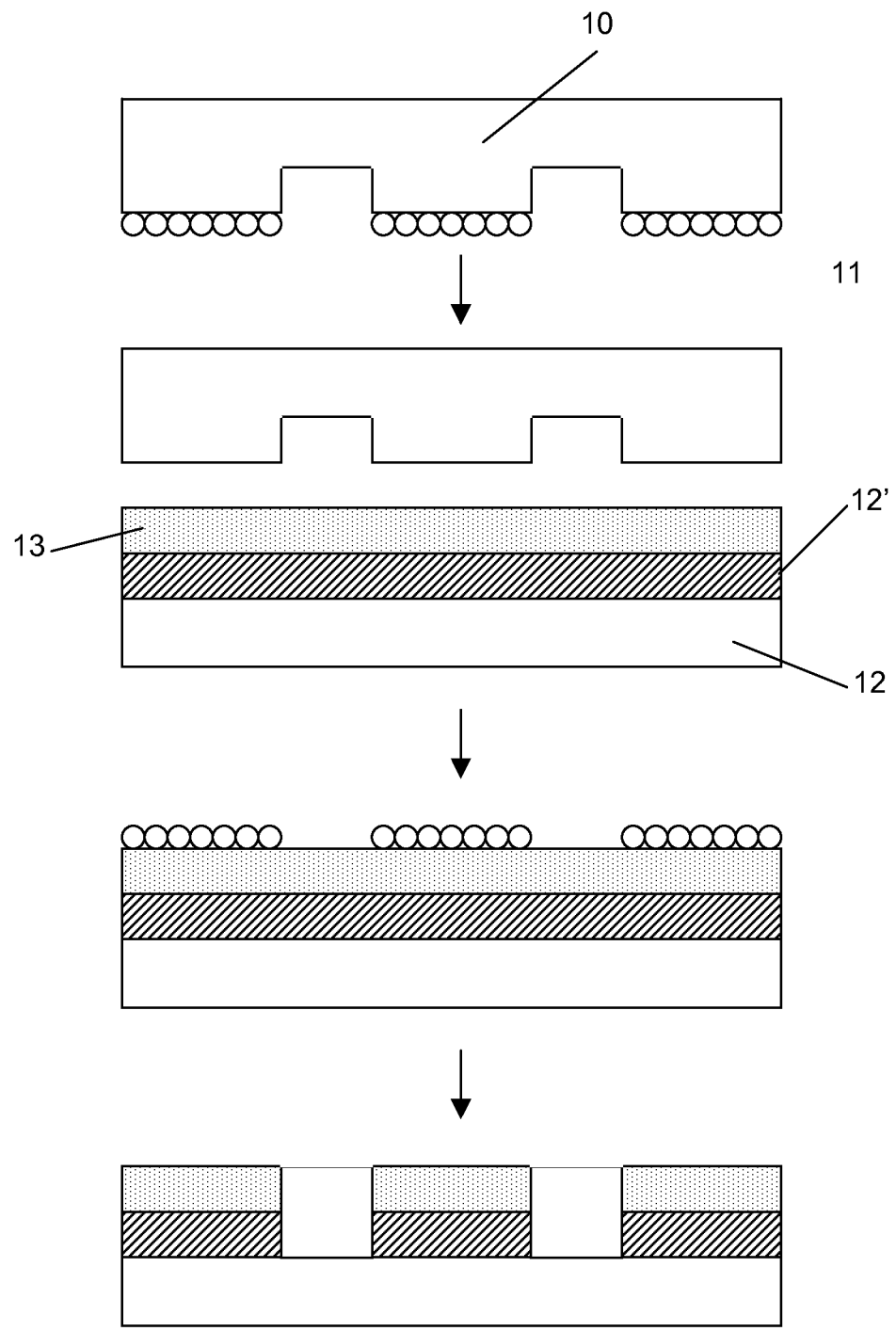
FIG. 1a-1c illustrate examples of soft, hot and UV lithography process respectively.
Figure 1B:
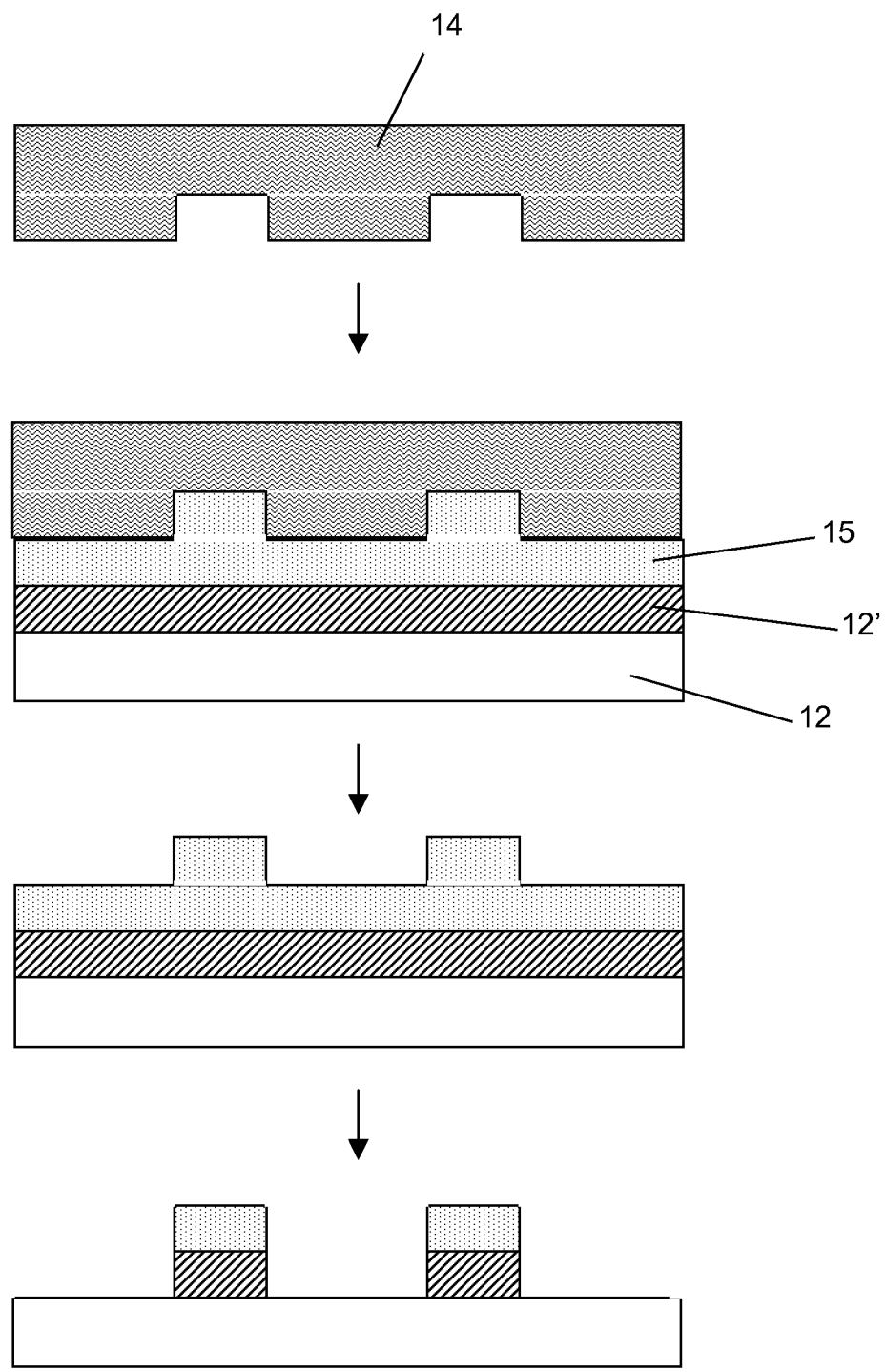
Figure 1C:
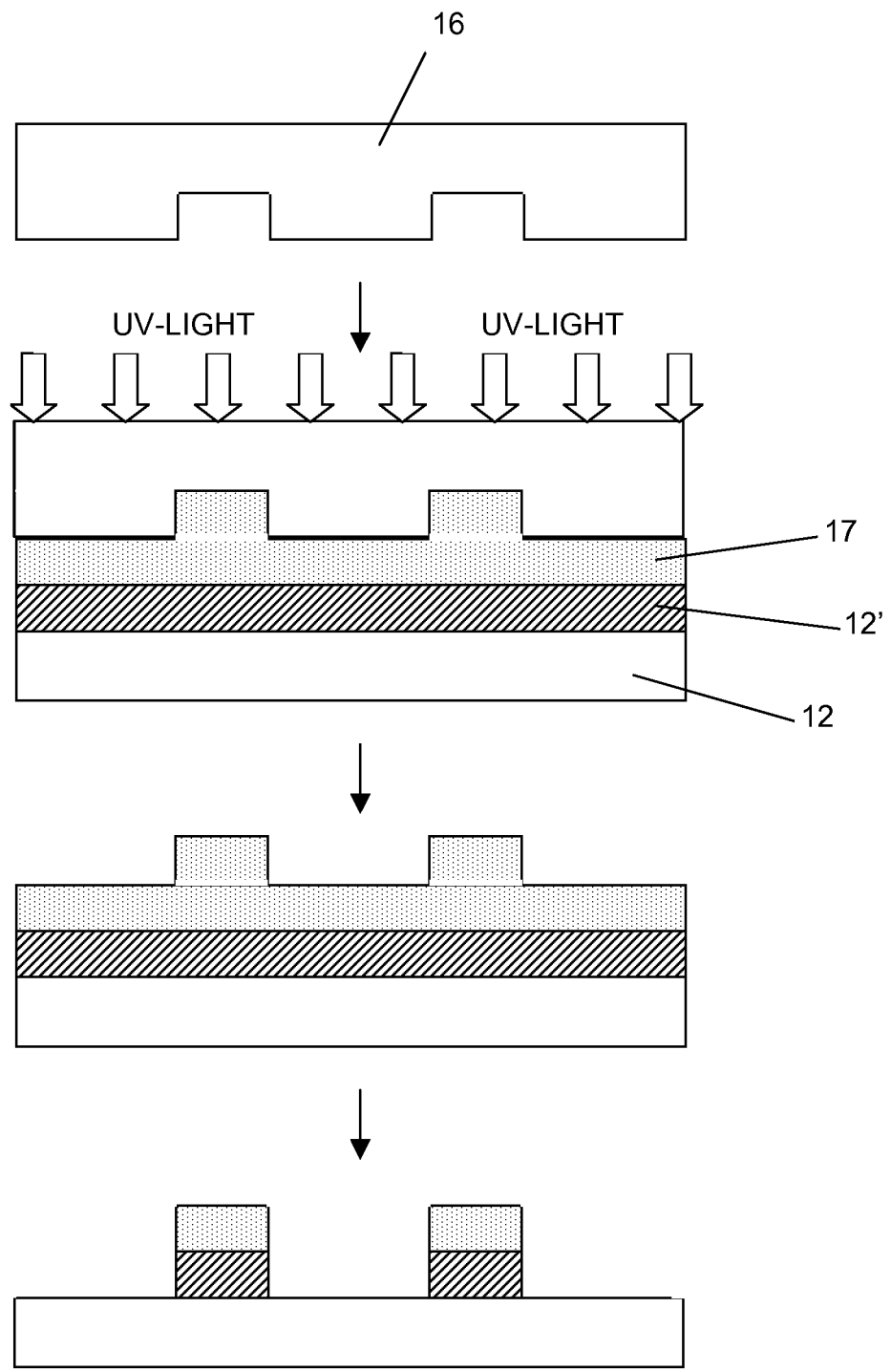

FIG. 1a schematically depicts the soft lithography process which involves transferring a layer of molecules 11 (typically an ink such as a thiol) from a flexible template 10 (typically fabricated from polydimethylsiloxane (PDMS)) onto a resist layer 13 which is supported upon a substrate 12 and planarization and transfer layer 12'. The template 10 has a pattern of features on its surface, the molecular layer being disposed upon the features. When the template is pressed against the resist layer, the layer of molecules 11 stick to the resist. Upon removal of the template from the resist, the layer of molecules 11 stick to the resist, the residual layer of resist is etched such that the areas of the resist not covered by the transferred molecular layer are etched down to the substrate.

The template used in soft lithography may be easily deformed and may therefore not be suited to high resolution applications, e.g. on a nanometer scale, since the deformation of the template may adversely affect the imprinted pattern. Furthermore, when fabricating multiple layer structures, in which the same region will be overlaid multiple times, soft imprint lithography may not provide overlay accuracy on a nanometer scale.

Hot imprint lithography (or hot embossing) is also known as nanoimprint lithography (NIL) when used on a nanometer scale. The process uses a harder template made from, for example, silicon or nickel, which are more resistant to wear and deformation. This is described for instance in U.S. Pat. No. 6,482,742 and illustrated in FIG. 1b. In a typical hot imprint process, a solid template 14 is imprinted into a thermosetting or a thermoplastic polymer resin 15, which has been cast on the surface of substrate. The resin may, for instance, be spin coated and baked onto the substrate surface or more typically (as in the example illustrated) onto a planarization and transfer layer 12'. It should be understood that the term "hard" when describing an imprint template includes materials which may generally be considered between "hard" and "soft" materials, such as for example "hard" rubber. The suitability of a particular material for use as an imprint template is determined by its application requirements.

When a thermosetting polymer resin is used, the resin is heated to a temperature such that, upon contact with the template, the resin is sufficiently flowable to flow into the pattern features defined on the template. The temperature of the resin is then increased to thermally cure (e.g. crosslink) the resin so that it solidifies and irreversibly adopts the desired pattern. The template may then be removed and the patterned resin cooled.

Examples of thermoplastic polymer resins used in hot imprint lithography processes are poly (methyl methacrylate), polystyrene, poly (benzyl methacrylate) or poly (cyclohexyl methacrylate). The thermoplastic resin is heated so that it is in a freely flowable state immediately prior to imprinting with the template. It is typically necessary to heat thermoplastic resin to a temperature considerably above the glass transition temperature of the resin. The template is pressed into the flowable resin and sufficient pressure is applied to ensure the resin flows into all the pattern features defined on the template. The resin is then cooled to below its glass transition temperature with the template in place whereupon the resin irreversibly adopts the desired pattern. The pattern will consist of the features in relief from a residual layer of the resin which may then be removed by an appropriate etch process to leave only the pattern features.

Figure 2:
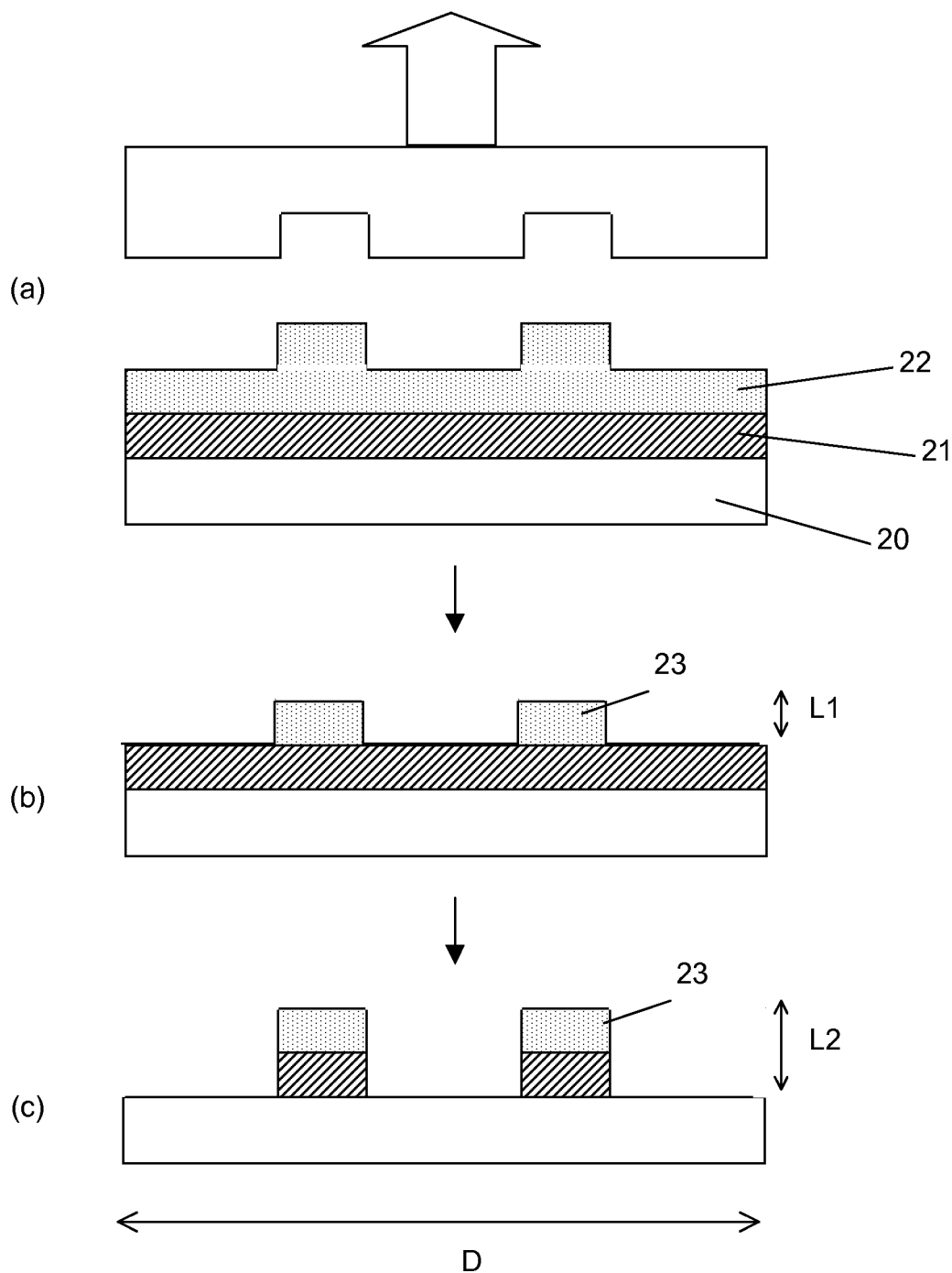
FIG. 2 illustrates a two step etching process employed when hot and UV imprint lithography is used to pattern a resist layer.

Upon removal of the template from the solidified resin, a two-step etching process is typically performed as illustrated in FIGS. 2a to 2c. The substrate 20 has a planarization and transfer layer 21 immediately upon it, as shown in FIG. 2a. The purpose of the planarization and transfer layer is twofold. It acts to provide a surface substantially parallel to that of the template, which helps ensure that the contact between the template and the resin is parallel, and also to improve the aspect ratio of the printed features, as will be described below.

After the template has been removed, a residual layer 22 of the solidified resin is left on the planarization and transfer layer 21, shaped in the desired pattern. The first etch is isotropic and removes parts of the residual layer 22, resulting in a poor aspect ratio of features where L1 is the height of the features 23, as shown in FIG. 2b. The second etch is anisotropic (or selective) and improves the aspect ratio. The anisotropic etch removes those parts of the planarization and transfer layer 21 which are not covered by the solidified resin, increasing the aspect ratio of the features 23 to (L2/D), as shown in FIG. 2c. The resulting polymer thickness contrast left on the substrate after etching can be used as for instance a mask for dry etching if the imprinted polymer is sufficiently resistant, for instance as a step in a lift-off process.

Hot imprint lithography suffers from a disadvantage in that not only must the pattern transfer be performed at a higher temperature, but also relatively large temperature differentials might be required in order to ensure the resin is adequately solidified before the template is removed. Temperature differentials between 35 and 100° C. may be needed. Differential thermal expansion between, for instance, the substrate and template may then lead to distortion in the transferred pattern. This may be exacerbated by the relatively high pressure required for the imprinting step, due the viscous nature of the imprintable material, which can induce mechanical deformation in the substrate, again distorting the pattern.

UV imprint lithography, on the other hand, does not involve such high temperatures and temperature changes nor does it require such viscous imprintable materials. Rather, UV imprint lithography involves the use of a partially or wholly transparent template and a UV-curable liquid, typically a monomer such as an acrylate or methacrylate. In general, any photopolymerisable material could be used, such as a mixture of monomers and an initiator. The curable liquid may also, for instance, include a dimethyl siloxane derivative. Such materials are less viscous than the thermosetting and thermoplastic resins used in hot imprint lithography and consequently move much faster to fill template pattern features. Low temperature and low pressure operation also favors higher throughput capabilities.

An example of a UV imprint process is illustrated in FIG. 1c. A quartz template 16 is applied to a UV curable resin 17 in a similar manner to the process of FIG. 1b. Instead of raising the temperature as in hot embossing employing thermosetting resins, or temperature cycling when using thermoplastic resins, UV radiation is applied to the resin through the quartz template in order to polymerise and thus cure it. Upon removal of the template, the remaining steps of etching the residual layer of resist are the same or similar as for the hot embossing process described above. The UV curable resins typically used have a much lower viscosity than typical thermoplastic resins so that lower imprint pressures can be used. Reduced physical deformation due to the lower pressures, together with reduced deformation due to high temperatures and temperature changes, makes UV imprint lithography suited to applications requiring high overlay accuracy. In addition, the transparent nature of UV imprint templates can accommodate optical alignment techniques simultaneously to the imprinting.

Although this type of imprint lithography mainly uses UV curable materials, and is thus generically referred to as UV imprint lithography, other wavelengths of radiation may be used to cure appropriately selected materials (e.g., activate a polymerization or cross linking reaction). In general, any radiation capable of initiating such a chemical reaction may be used if an appropriate imprintable material is available. Alternative "activating radiation" may, for instance, include visible light, infrared radiation, x-ray radiation and electron beam radiation. In the general description above, and below, references to UV imprint lithography and use of UV radiation are not intended to exclude these and other activating radiation possibilities.

As an alternative to imprint systems using a planar template which is maintained substantially parallel to the substrate surface, roller imprint systems have been developed. Both hot and UV roller imprint systems have been proposed in which the template is formed on a roller but otherwise the imprint process is very similar to imprinting using a planar template. Unless the context requires otherwise, references to an imprint template include references to a roller template.

There is a particular development of UV imprint technology known as step and flash imprint lithography (SFIL) which may be used to pattern a substrate in small steps in a similar manner to optical steppers conventionally used, for example, in IC manufacture. This involves printing small areas of the substrate at a time by imprinting a template into a UV curable resin, 'flashing' UV radiation through the template to cure the resin beneath the template, removing the template, stepping to an adjacent region of the substrate and repeating the operation. The small field size of such step and repeat processes may help reduce pattern distortions and CD variations so that SFIL may be particularly suited to manufacture of IC and other devices requiring high overlay accuracy.

Although in principle the UV curable resin can be applied to the entire substrate surface, for instance by spin coating, this may be problematic due to the volatile nature of UV curable resins.

One approach to addressing this problem is the so-called 'drop on demand' process in which the resin is dispensed onto a target portion of the substrate in droplets immediately prior to imprinting with the template. The liquid dispensing is controlled so that a predetermined volume of liquid is deposited on a particular target portion of the substrate. The liquid may be dispensed in a variety of patterns and the combination of carefully controlling liquid volume and placement of the pattern can be employed to confine patterning to the target area.

Dispensing the resin on demand as mentioned is not a trivial matter. The size and spacing of the droplets are carefully controlled to ensure there is sufficient resin to fill template features while at the same time minimizing excess resin which can be rolled to an undesirably thick or uneven residual layer since as soon as neighboring drops touch the resin will have nowhere to flow.

Although reference is made above to depositing UV curable liquids onto a substrate, the liquids could also be deposited on the template and in general the same techniques and considerations will apply.

Figure 3:
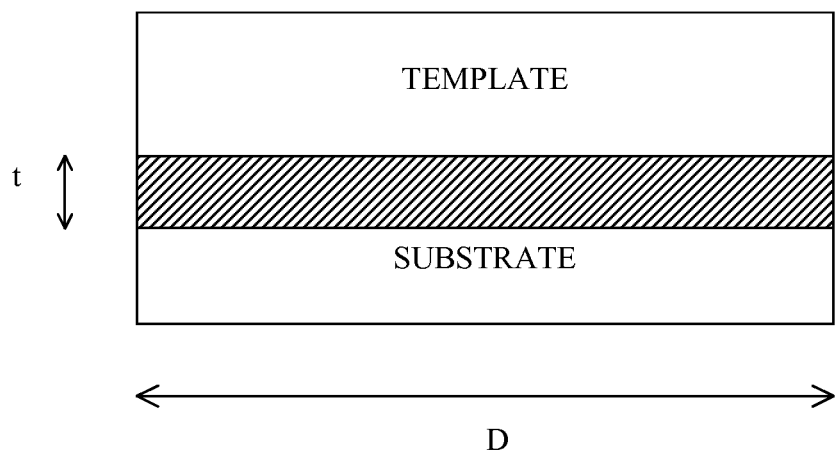
FIG. 3 illustrates relative dimensions of template features compared to the thickness of a typical imprintable resist layer deposited on a substrate.

FIG. 3 illustrates the relative dimensions of the template, imprintable material (curable monomer, thermosetting resin, thermoplastic, etc.), and substrate. The ratio of the width of the substrate, D, to the thickness of the curable resin layer, t, is of the order of $10^6$. It will be appreciated that, in order to avoid the features projecting from the template damaging the substrate, the dimension t should be greater than the depth of the projecting features on the template.

The residual layer of imprintable material left after stamping is useful in protecting the underlying substrate, but may also impact obtaining high resolution and/or overlay accuracy. The first 'breakthrough' etch is isotropic (non-selective) and will thus to some extent erode the features imprinted as well as the residual layer. This may be exacerbated if the residual layer is overly thick and/or uneven.

This etching may, for instance, lead to a variation in the thickness of features ultimately formed on the underlying substrate (i.e. variation in the critical dimension). The uniformity of the thickness of a feature that is etched in the transfer layer in the second anisotropic etch is dependant upon the aspect ratio and integrity of the shape of the feature left in the resin. If the residual resin layer is uneven, then the non-selective first etch may leave some of these features with "rounded" tops so that they are not sufficiently well defined to ensure good uniformity of feature thickness in the second and any subsequent etch process.

In principle, the above problem may be reduced by ensuring the residual layer is as thin as possible but this may require application of undesirably large pressures (possibly increasing substrate deformation) and relatively long imprinting times (perhaps reducing throughput).

As noted above, the resolution of the features on the template surface is a limiting factor on the attainable resolution of features printed on the substrate. The templates used for hot and UV imprint lithography are generally formed in a two-stage process. Initially, the required pattern is written using, for example, electron beam writing to give a high resolution pattern in resist. The resist pattern is then transferred into a thin layer of chrome which forms the mask for the final, anisotropic etch step to transfer the pattern into the base material of the template. Other techniques such as for example ion-beam lithography, X-ray lithography, extreme UV lithography, epitaxial growth, thin film deposition, chemical etching, plasma etching, ion etching or ion milling could be used. Generally, a technique capable of very high resolution will be desired as the template is effectively a 1× mask with the resolution of the transferred pattern being limited by the resolution of the pattern on the template.

The release characteristics of the template are also a consideration. The template may, for instance, be treated with a surface treatment material to form a thin release layer on the template having a low surface energy (a thin release layer may also be deposited on the substrate).

Another consideration in the development of imprint lithography is the mechanical durability of the template. The template may be subjected to large forces during stamping of the imprintable medium, and in the case of hot imprint lithography, it may also be subjected to high pressure and temperature. The force, pressure and/or temperature may cause wearing of the template, and may adversely affect the shape of the pattern imprinted upon the substrate.

In hot imprint lithography, a potential advantage may be realized in using a template of the same or similar material to the substrate to be patterned in order to help reduce differential thermal expansion between the two. In UV imprint lithography, the template is at least partially transparent to the activation radiation and accordingly quartz templates are used.

Although specific reference may be made in this text to the use of imprint lithography in the manufacture of ICs, it should be understood that imprint apparatus and methods described may have other applications, such as the manufacture of integrated optical systems, guidance and detection patterns for magnetic domain memories, hard disk magnetic media, flat panel displays, thin-film magnetic heads, etc.

While in the description above particular reference has been made to the use of imprint lithography to transfer a template pattern to a substrate via an imprintable resin effectively acting as a resist, in some circumstances the imprintable material may itself be a functional material, for instance having a functionally such as conductivity, optical linear or non linear response, etc. For example, the functional material may form a conductive layer, a semiconductive layer, a dielectric layer or a layer having another desirable mechanical, electrical or optical property. Some organic substances may also be appropriate functional materials. Such applications may be within the scope of one or more embodiments of the invention.

Although imprint lithography theoretically provides many benefits over conventional optical lithography, in order for it to be adopted widely in industry it should be economically viable. The costs involved are primarily determined by the costs of the tooling and template manufacture, and the production efficiency or throughput. In spite of the expectation that tooling costs will be relatively low, this may be more than offset by the fact that template production costs are likely to be relatively high since the template is necessarily the same size as the pattern to be imprinted into the substrate (imprint lithography being a 1× process). When a single volume of an imprintable medium is provided on a substrate surface, the imprinting time is largely dependent upon the template area. In essence, as the area of the template increases the imprinting time decreases. Thus, designing an economically viable imprinting process is problematic because of the need to find a balance between the high costs involved in producing larger 1× templates and the desire to reduce imprinting times by employing larger templates.

Figure 4:
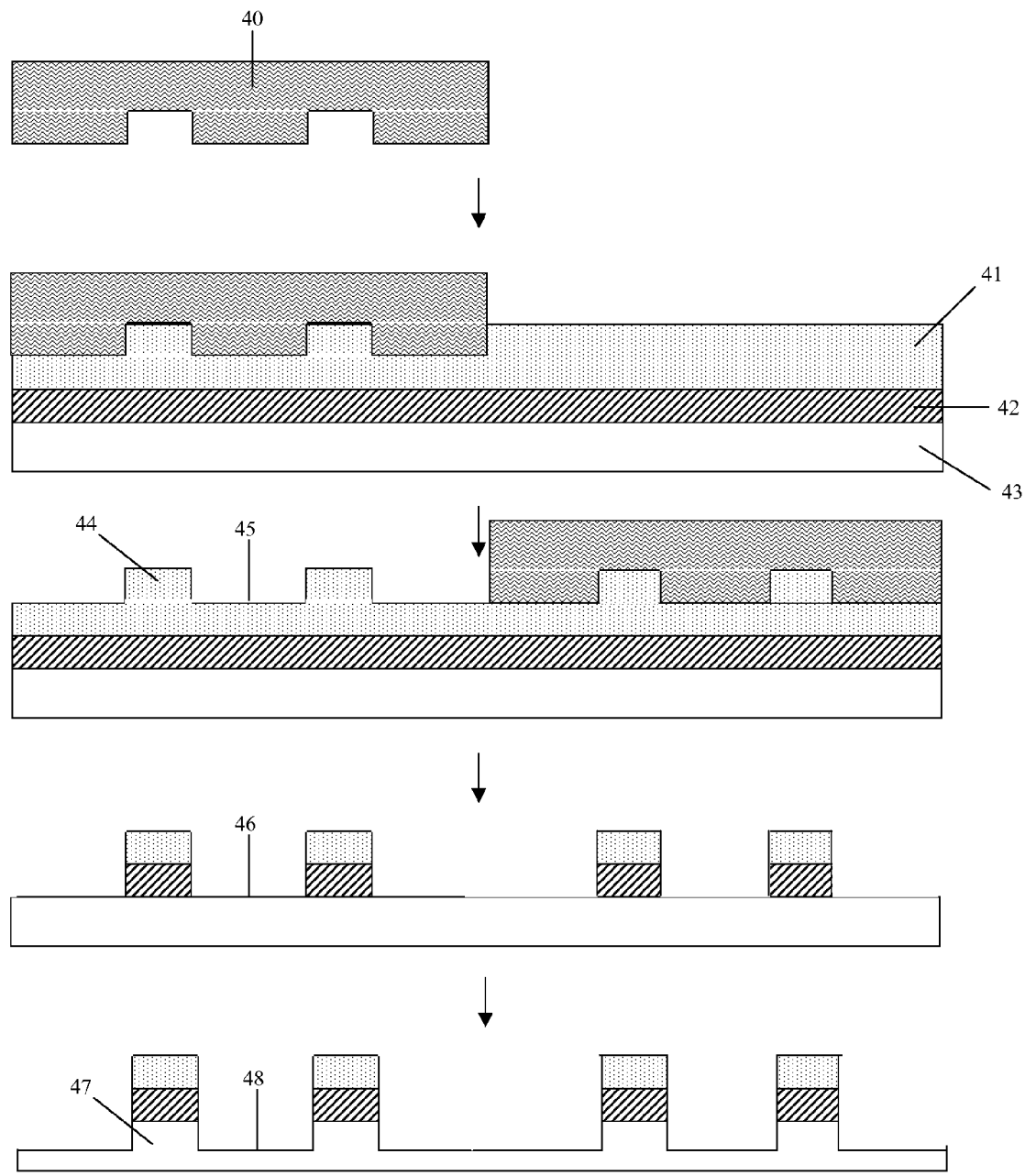
FIG. 4 illustrates manufacture of a working template in accordance with an embodiment of the invention.

FIG. 4 shows a quartz master template 40, previously fabricated using a conventional technique involving e-beam etching, being imprinted into a first target region of a volume of a thermoplastic imprintable medium 41 shown on the left of FIG. 4. The imprintable medium 41 is supported on an intermediate layer (e.g., of chromium) 42 which is itself supported on a quartz working template substrate layer 43. The master template 40 defines a portion of a final pattern which is to be imprinted into the template substrate 43 and which can then be imprinted into a device substrate. Contacting the imprintable medium 41 with the master template forms a plurality of upstanding pattern features 44 and areas of reduced thickness 45. The master template 40 is then separated from the first target region of the imprintable medium 41 and imprinted into a second target region of the medium 41, shown on the right of FIG. 4, so as to form an identical arrangement of pattern features and areas of reduced thickness as were formed in the first target region.

Once the complete final pattern has been formed in the layer of imprintable medium 41, a first etch removes the exposed regions of the intermediate layer 42 and a second etch removes the exposed regions 46 of the template substrate layer 43 so as to form pattern features 47 and areas of reduced thickness 48 defining the final pattern in the template substrate layer 43. To complete the process, the layers of imprintable medium 41 and intermediate layer 42 lying directly above the pattern features 47 in the template substrate layer 43 are removing by a conventional technique.

Following manufacture of the patterned working template, it can then be used in subsequent processing steps to pattern device substrates with the complete final pattern.

The size and arrangement of the pattern may of course be chosen to suit any particular application. Moreover, the master template may be imprinted any suitable number of times to provide the desired final pattern. The different target areas of imprintable medium may be located in any appropriate way on the substrate surface, for example they may be adjacent one another as shown in FIG. 4, or they may be spaced apart.

The cost and complexity of the imprint process may also be increased as a result of the desire to operate the process under vacuum and/or high imprinting pressure to avoid problems relating to gas (e.g., air) being trapped within the imprinted medium. It is envisaged that a relatively cheap and simple way to reduce costs in this regard would be to provide a localized low pressure channel (or perhaps a vacuum channel) around the imprint area. A suitable arrangement is shown schematically in FIG. 5.

Figure 5:
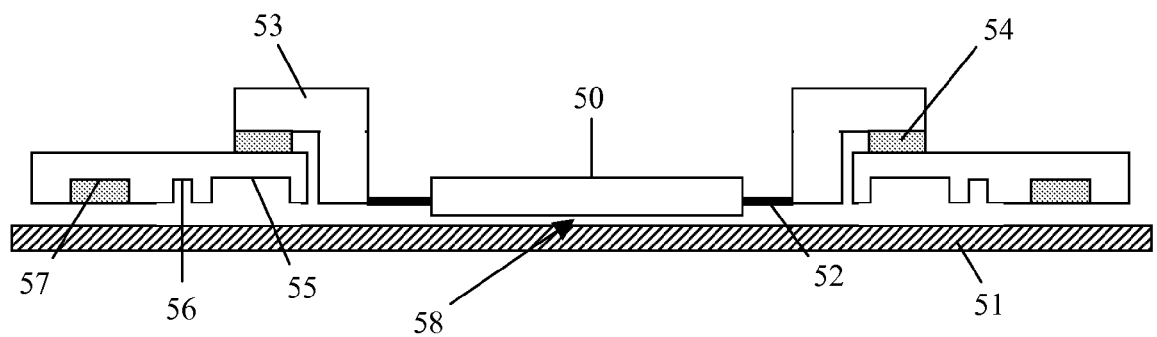
FIG. 5 is a schematic representation of an imprint system incorporating a gas bearing.

FIG. 5 shows a template 50 to be used to pattern a substrate 51. The template 50 is supported on a pair of plate springs 52 which are connected to arms 53 mounted on piezo actuators 54. Laterally outward of the arms 53 is a low pressure channel 55, laterally outward of the low pressure channel 55 is a neutral pressure channel 56, and laterally outward of the neutral pressure channel 56 is a high pressure channel 57. The pressure differential produced between the three channels 55, 56, 57 causes the template 50 to float a predefined distance above the surface of a volume of imprintable medium (not shown) provided on the surface of the substrate 51. By controlling the pressure differential, the imprinting and separation processes can be controlled. For example, by decreasing pressure in the high pressure channel 57, the template 50 can be caused to contact the medium, and by increasing pressure in the high pressure channel 57, the template 50 can be caused to separate from the medium. Optionally, the space 58 below the template 50 can also be operated at low pressure or vacuum. The large low pressure area thus created can be used as (part of) the preload of a gas bearing employed in the imprinting process. It will be evident to the skilled person that such a system provides a relatively simple solution to the problem of gas bubbles being entrapped within the imprintable medium.

The provision of such a low pressure channel around the imprinting area also may have a benefit in the fabrication of optical structures in which the inclusion of gas bubbles may cause yield problems.

The concept of employing a low pressure channel around the imprinting area provides a further benefit. During imprinting, an amount of imprintable medium is squeezed out from under the template until the desired template/substrate gap is obtained (e.g. 50 nm). Many imprint processes are carried out at atmospheric pressure and so a component of the force applied to the template to imprint the desired pattern is provided to ensure sufficient excess imprintable medium is squeezed out. Provision of a low pressure channel around the imprinting area may enable the excess imprintable medium to be squeezed out from under the template more easily and consequently reduce the component of the imprinting force required to squeeze out the excess medium. An additional advantage of this method is that it may even out any pressure imbalance between the template and the imprintable medium. This method should increase imprinting times and reduce mechanical distortions during the imprinting process.

While specific embodiments of the invention have been described above, it will be appreciated that the invention may be practiced otherwise than as described. The description is not intended to limit the invention.

We claim:

1. A working template manufacturing apparatus, comprising:
   a working template substrate;
   a master template having a pattern to form at least part of a working template pattern of the working template substrate configured to imprint a pattern on a device substrate;
   a substrate holder configured to hold the working template substrate; and
   a template holder configured to cause the master template supported by the template holder to contact an imprintable medium on the working template substrate to form a first imprint in the medium, the first imprint defining the part of a working template pattern, to cause the master template to contact the imprintable medium to form a second imprint in the medium, the second imprint defining a further part of the working template pattern, and to cause the master template to separate from the imprinted medium.

2. The apparatus according to claim 1, further comprising a dosing apparatus configured to provide a volume of the imprintable medium on the working template substrate.

3. The apparatus according to claim 1, further comprising an etching apparatus.

4. The apparatus according to claim 1, wherein the first imprint and the second imprint are laterally spaced from one another.

5. The apparatus according to claim 1, wherein the working template substrate is photo transparent.

6. The apparatus according to claim 1, wherein an intermediate layer is provided between the working template substrate and the imprintable medium.

7. The apparatus according to claim 6, wherein the intermediate layer comprises a material selected from a group consisting of: chromium, an oxide and a nitride.

8. A working template manufacturing apparatus, comprising:
   a working template substrate;
   a master template having a pattern to form at least part of a working template pattern of the working template substrate configured to imprint a pattern on a device substrate;
   a substrate holder configured to hold the working template substrate;
   a template holder configured to cause the master template supported by the template holder to contact an imprintable medium on the working template substrate to form a first imprint in the medium, the first imprint comprising a first pattern feature and a first area of reduced thickness and defining a part of the working template pattern, to cause the master template to contact the imprintable medium to form a second imprint in the medium, the second imprint comprising a second pattern feature and a second area of reduced thickness and defining a further part of the working template pattern, and to cause the master template to separate from the imprinted medium; and
   an etching apparatus configured to etch the first and second areas of reduced thickness to expose regions of the working template substrate and to etch the exposed regions of the working template substrate to form the working template pattern in the working template substrate to define a working template configured to imprint a pattern on a device substrate.

9. The apparatus according to claim 8, further comprising a dosing apparatus configured to provide a volume of the imprintable medium on the working template substrate.

10. The apparatus according to claim 8, wherein the first imprint and the second imprint are laterally spaced from one another.

11. The apparatus according to claim 8, wherein the working template substrate is photo transparent.

12. The apparatus according to claim 8, wherein the etching apparatus is configured to etch the exposed regions of the working template substrate using an etchant selected from a group consisting of: $CHF_3$, $CF_4$, $O_2$, $Cl_2$, HBr and $SF_6$.

13. The apparatus according to claim 8, wherein an intermediate layer is provided between the working template substrate and the imprintable medium.

14. The apparatus according to claim 13, wherein etch of the first and second areas of reduced thickness exposes regions of the intermediate layer and the etching apparatus is configured to etch the exposed regions of the intermediate layer to expose a region of the working template substrate.

15. The apparatus according to claim 14, wherein the etching apparatus is configured to etch the exposed regions of the working template substrate to form the working template pattern in the working template substrate to define the working template.

16. The apparatus according to claim 14, wherein the etching apparatus is configured to etch the exposed regions of the intermediate layer using an etchant selected from a group consisting of: hydrofluoric acid, $O_2$ and $Cl_2$.

17. The apparatus according to claim 13, wherein the intermediate layer comprises a material selected from a group consisting of: chromium, an oxide and a nitride.

18. A manufacturing apparatus, comprising:
a working template substrate;
a master template having a pattern to form at least part of a working template pattern of the working template substrate configured to imprint a pattern on a device substrate;
a substrate holder configured to hold the working template substrate; and
a template holder configured to cause the master template supported by the template holder to contact an imprintable medium on the working template substrate to form a first imprint in the medium, the first imprint defining a part of the working template pattern, to cause the master template to contact the imprintable medium to form a second imprint in the medium, the second imprint defining a further part of the working template pattern, and to cause the working template to contact a second imprintable medium on a device substrate to form an imprint in the second medium corresponding to the working template pattern.

19. The apparatus according to claim 18, further comprising an etching apparatus configured to etch areas of reduced thickness of the first and second imprints to expose regions of the working template substrate.

20. The apparatus according to claim 19, wherein the etching apparatus is configured to etch areas of reduced thickness of the imprint in the second medium to expose regions of the device substrate.

* * * * *